United States Patent
Ding et al.

(10) Patent No.: US 9,659,830 B2
(45) Date of Patent: May 23, 2017

(54) DIMENSION DETECTION DEVICE AND CASSETTE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yang Ding, Beijing (CN); Jiangtao Zhang, Beijing (CN); Lele Sun, Beijing (CN); Zhenlong Li, Beijing (CN)

(73) Assignees: BOE TECHNOLOGY GROUP CO., LTD. (CN); HEFEI BOE OPTOELECTRONICS TECHNOLOGY CO., LTD. (CN)

(*) Notice: Subject to any disclaimer, the term of this patent is extended or adjusted under 35 U.S.C. 154(b) by 0 days.

(21) Appl. No.: 15/086,926

(22) Filed: Mar. 31, 2016

(65) Prior Publication Data
US 2016/0290787 A1 Oct. 6, 2016

(30) Foreign Application Priority Data

Apr. 3, 2015 (CN) .......................... 2015 1 0158872

(51) Int. Cl.
*G01B 11/14* (2006.01)
*G01B 11/02* (2006.01)
(Continued)

(52) U.S. Cl.
CPC ............ *H01L 22/00* (2013.01); *G01B 11/002* (2013.01)

(58) Field of Classification Search
CPC ............ G01B 11/02; G01B 11/14; G02F 1/13
(Continued)

(56) References Cited

U.S. PATENT DOCUMENTS 4,602,163 A * 7/1986 Pryor ................... A01B 69/008
250/559.33
5,456,020 A * 10/1995 Kellner ..................... G01D 5/34
33/706
(Continued)

FOREIGN PATENT DOCUMENTS

| CN | 103515219 A | 1/2014 |
| CN | 104282605 A | 1/2015 |
| JP | 2005158809 A | 6/2005 |

OTHER PUBLICATIONS

Office Action in Chinese Patent Application No. 201510158872.5, dated Dec. 28, 2016.

*Primary Examiner* — Roy M Punnoose
(74) *Attorney, Agent, or Firm* — Brooks Kushman P.C.

(57) ABSTRACT

A dimension detection device includes a first detection unit which is moved to a first predetermined position in a first direction, and configured to detect a current position of the first member, and when the current position of the first member is not a third predetermined position corresponding to the first predetermined position, send a first signal; a second detection unit which is moved to a second predetermined position in the first direction, and configured to detect a current position of the second member, and when the current position of the second member is not a fourth predetermined position corresponding to the second predetermined position, send a second signal; a movement unit which is configured to move the first detection unit and the second detection unit; and an alarm unit configured to send an alarm upon the receipt of the first signal and/or the second signal.

20 Claims, 4 Drawing Sheets

(51) Int. Cl.
*H01L 21/66* (2006.01)
*G01B 11/00* (2006.01)

(58) Field of Classification Search
USPC .......................................................... 356/625
See application file for complete search history.

(56) References Cited

U.S. PATENT DOCUMENTS

| | | | | |
|---|---|---|---|---|
| 7,114,265 B2* | 10/2006 | Mies | ............... | G01B 11/005 33/1 M |
| 7,127,824 B2* | 10/2006 | Mies | ............... | G01B 5/0009 33/1 M |
| 2004/0231177 A1* | 11/2004 | Mies | ............... | G01B 11/005 33/503 |
| 2004/0246499 A1* | 12/2004 | Mies | ............... | G01B 5/0009 356/614 |
| 2009/0071024 A1* | 3/2009 | Strack | ............... | G01B 5/061 33/504 |
| 2013/0068727 A1 | 3/2013 | Okita | | |

* cited by examiner

DIMENSION DETECTION DEVICE AND CASSETTE

CROSS-REFERENCE TO RELATED APPLICATION

The present application claims a priority of the Chinese patent application No. 201510158872.5 filed on Apr. 3, 2015, which is incorporated herein by reference in its entirety.

TECHNICAL FIELD

The present disclosure relates to a dimension detection device, in particular to a dimension detection device for detecting a dimension of a cassette used for accommodating a substrate in a semiconductor manufacture field, a display panel, or a plasma display panel (PDP), and the cassette including the dimension detection device.

BACKGROUND

During the manufacture of thin film transistor-liquid crystal display (TFT-LCD), it is necessary to accommodate a liquid crystal panel or substrate within a cassette.

When accommodating the liquid crystal panels or substrates in different dimensions, it is required to correspondingly modify a dimension of the cassette. Currently, the modification is made manually rather than by a dedicated detection device. After the modification of the dimension has been completed, the cassette may be confirmed by an operator and then used. However, the dimension of the cassette may be modified frequently each day, and there is no dedicated detection device for detecting the modified dimension of the cassette, so an error may easily occur. When the liquid crystal panels or substrates are picked from or placed into the cassette by a mechanical arm, collision may occur. As a result, the liquid crystal panels or substrates, or the mechanical arm, may be damaged, and a loss may be caused.

SUMMARY

An object of the present disclosure is to provide a dimension detection device and a cassette including the dimension detection device, so as to detect a dimension of the cassette, thereby to prevent any losses due to misoperation made by the operator.

In one aspect, the present disclosure provides in some embodiments a dimension detection device for detecting whether or not a first member and a second member in a to-be-detected piece are at predetermined positions, including: a first detection unit which is moved to a first predetermined position in a first direction, and configured to detect a current position of the first member, and when the current position of the first member is not a third predetermined position corresponding to the first predetermined position, send a first signal; a second detection unit which is moved to a second predetermined position in the first direction, and configured to detect a current position of the second member, and when the current position of the second member is not a fourth predetermined position corresponding to the second predetermined position, send a second signal; a movement unit configured to move the first detection unit and the second detection unit; and an alarm unit configured to send an alarm upon the receipt of the first signal and/or the second signal.

Alternatively, the first detection unit includes: a first laser beam transmitter arranged at a side of the first member and configured to transmit parallel laser beams, a plane formed by the parallel laser beams from the first laser beam transmitter being perpendicular to the first direction; and a first laser beam receiver arranged at another side of the first member, and configured to receive the parallel laser beams from the first laser beam transmitter, and when a light intensity of the received laser beams is less than a predetermined light intensity, send the first signal.

Alternatively, the second detection unit includes: a second laser beam transmitter arranged at a side of the second member and configured to transmit parallel laser beams, a plane formed by the parallel laser beams from the second laser beam transmitter being perpendicular to the first direction; and a second laser beam receiver arranged at another side of the second member, and configured to receive the parallel laser beams from, the second laser beam transmitter, and when a light intensity of the received laser beams is less than a predetermined light intensity, send the second signal.

Alternatively, the movement unit includes a first movement mechanism for moving the first detection unit and the second detection unit in the first direction.

Alternatively, the first movement mechanism includes: a fixation plate fixed onto the to-be-detected piece; a first connection rod on which the first detection unit is mounted; a second connection rod on which the second detection unit is mounted; a guide rail arranged on the fixation plate and extending in the first direction; a first slider and a second slider arranged on the guide rail and capable of being moved along the guide rail, the first slider being connected to the first connection rod and configured to move the first connection rod, and the second slider being connected to the second connection rod and configured to move the second connection rod; and a driving mechanism configured to drive the first slider and the second slider to move along the guide rail.

Alternatively, the driving mechanism includes a first screw rod extending in the first direction and cooperating with the first slider, a second screw rod extending in the first direction and cooperating with the second slider, a first drive motor configured to drive the first screw rod, and a second drive motor configured to drive the second screw rod.

Alternatively, wherein the first drive motor and the second drive motor are each a servo motor, and the first screw rod is connected to the second screw rod via a coupling.

Alternatively, the first member and the second member are each of a column structure extending in a second direction perpendicular to the first direction, and the movement unit further includes a second movement mechanism configured to move the first detection unit and the second detection unit in the second direction.

Alternatively, the second movement mechanism includes a first cylinder configured to drive the first detection unit to move in the second direction, and a second cylinder configured to drive the second detection unit to move in the second direction.

Alternatively, wherein the second movement mechanism comprises a servo motor and a screw rod.

Alternatively, the dimension detection device further includes further comprising a delimiting structure arranged on each of the first connection rod and the second connection rod, so as to enable the first laser beam transmitter of the first detection unit to be located at a position corresponding to the first laser beam receiver and enable the second laser beam transmitter of the second detection unit to be located at a position corresponding to the second laser beam receiver when the first detection unit and the second detection unit are moved in the second direction.

Alternatively, the dimension detection device further includes a control unit configured to control the movement unit. The control unit includes a storage module configured to store information about the predetermined positions of the first detection unit and the second detection unit, and a control module configured to control the first detection unit to move to the first predetermined position and/or control the second detection unit to move to the second predetermined position in accordance with the information stored in the storage module.

Alternatively, the to-be-detected piece is a cassette for accommodating a liquid crystal panel or a substrate. The cassette includes a first stmt and a second strut extending in the second direction and capable of being moved in the first direction, and a plurality of slot pins for supporting the liquid crystal panel or substrate is distributed on the first strut and the second strut in the second direction. The first member is the first strut and the second member is the second strut.

Alternatively, wherein the first laser beam transmitter and the first laser beam receiver are each a light-transmittable laser sensor.

In another aspect, the present disclosure provides in some embodiments a cassette, including a body and the above-mentioned dimension detection device. The body includes a first strut and a second strut extending in a second direction and capable of being moved in a first direction, and a plurality of slot pins is distributed on the first strut and the second strut in the second direction. The first member is the first strut, and the second member is the second strut.

In another aspect, a dimension detection method for detecting a dimension of the cassette according to claim 16, includes steps of: moving a first strut and a second strut in a first direction, so as to modify the dimension of the cassette; moving a first detection unit and a second detection unit by a movement unit from initial positions to predetermined positions corresponding to a dimension of a substrate to be currently accommodated in the cassette respectively; detecting by the first detection unit whether or not a current position of the first strut is a right position, detecting by the second detection unit whether or not a current position of the second strut is a right position, and when an error occurring for the positions of the first strut and/or the second strut has been detected, sending an alarm by an alarm unit; and moving the first strut and the second strut again when the alarm is sent by the alarm unit, so as to modify the dimension of the cassette until no alarm is sent by the alarm unit.

Alternatively, the step of detecting whether or not the current position of the first strut is a right position includes detecting whether or not the first detection unit is exactly arranged opposite to the first strut in a third direction perpendicular to the first direction.

Alternatively, the step of detecting whether or not the current position of the second stmt is a right position includes detecting whether or not the second detection unit is exactly arranged opposite to the second strut in a third direction perpendicular to the first direction.

Alternatively, the method further includes moving the first detection unit and the second detection unit by the movement unit in the first direction to the initial positions respectively after no alarm is sent by the alarm unit any more.

According to the dimension detection device in the embodiments of the present disclosure, it is able to detect whether or not two members in the to-be-detected piece are located at the predetermined positions, thereby to detect whether or not a distance between the two members is equal to a predetermined distance. Before the use of the cassette, a modified dimension of the cassette (i.e., the distance between the two struts in the cassette) may be detected by an operator through detecting the positions of the two struts in the cassette. When there is an error in the modified dimension of the cassette, the alarm may be sent. As a result, it is able to effectively prevent the liquid crystal panel or a mechanical arm from being damaged due to the error in the dimension of the cassette, thereby to reduce the unnecessary losses.

According to some alternative embodiments of the present disclosure, it is also able for the dimension detection device to, when detecting the dimension of the cassette, prevent the occurrence of a detection error due to the missing or deformation of the slot pins on the struts of the cassette, In addition, according to some alternative embodiments of the present disclosure, it is also able for the dimension detection device to detect the cassette accommodating the liquid crystal panels or substrates in different dimensions in a fast switching manner. Through the high-precise, automatic detection, it is able to effectively reduce the misoperation of the operator, thereby to prevent the liquid crystal panel or substrate, as well as the mechanical arm, from being damaged.

DETAILED DESCRIPTION OF THE EMBODIMENTS

Figure 1:
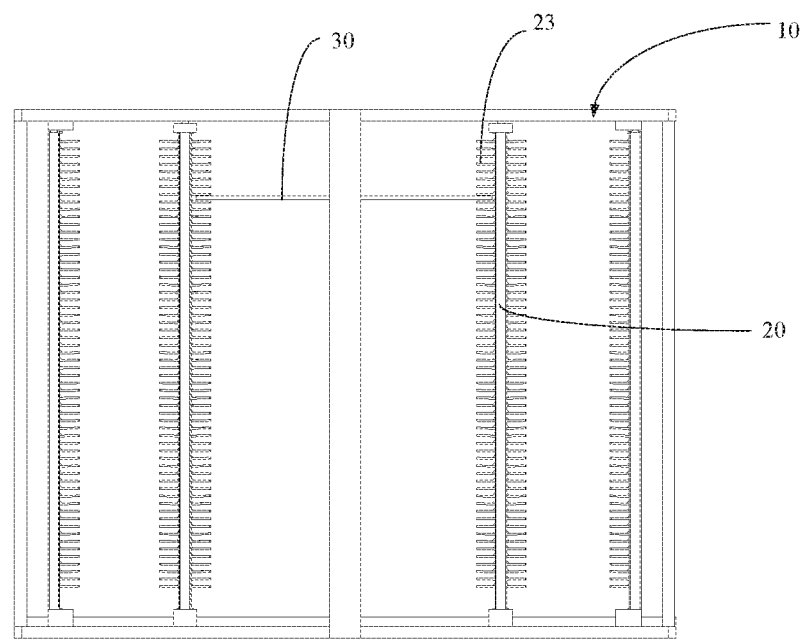
FIG. 1 is a schematic view showing a cassette in a related art.

The present disclosure will be described hereinafter in conjunction with the drawings and embodiments. The following embodiments are for illustrative purposes only, but shall not be used to limit the scope of the present disclosure.

The present disclosure provides in some embodiments a dimension detection device, so as to detect whether or not a first member and a second member in a to-be-detected piece are at predetermined positions, thereby to detect whether or not a distance between the first member and the second member in a first direction is equal to a predetermined distance.

The dimension detection device includes: a first detection unit which is moved to a first predetermined position in a first direction, and configured to detect a current position of the first member, and when the current position of the first member is not a third predetermined position corresponding to the first predetermined position, send a first signal; a second detection unit which is moved to a second predetermined position in the first direction, and configured to detect a current position of the second member, and when the current position of the second member is not a fourth predetermined position corresponding to the second predetermined position, send a second signal; a movement unit which is configured to move the first detection unit and the second detection unit; and an alarm unit configured to send an alarm upon the receipt of the first signal and/or the second signal.

According to the dimension detection device in the embodiments of the present disclosure, the first detection unit is moved in the first direction to the first predetermined position, and the second detection unit is moved in the first direction to the second predetermined position, so as to enable a distance between the first detection unit and the second detection unit to be equal to the predetermined distance. Then, the first detection unit detects whether or not the current position of the first member is a right position (e.g., whether or not the first member is exactly arranged opposite to the first detection unit), and the second detection unit detects whether or not the current position of the second member is a right position (e.g., whether or not the second member is exactly arranged opposite to the second detection unit). When it is detected that an error occurs for the current positions of the first member and/or the second position, the alarm is sent, so as to prompt an operator to change the positions of the first member and/or the second member, until the first member and/or the second member are located at the right positions. As a result, it is able to prevent the error occurring for the positions of the first member and/or the second member.

The dimension detection device will be described hereinafter when it is used for detecting a dimension of a cassette. It should be appreciated that, the dimension detection device may also be used to detect a dimension of any other to-be-detected piece.

As shown in FIG. 1, which is a schematic view showing a cassette in a related art, the cassette includes a frame structure 10 defining an accommodation space, and a plurality of struts 20 arranged within the frame structure 10 and capable of being moved horizontally within the frame structure 10. Each strut 20 is provided with a plurality of slot pins 23 in an extension direction of the strut 20.

When liquid crystal panels or substrates in different dimensions are accommodated in the cassette, the struts may be moved, so as to enable a distance between the adjacent struts to be adapted to a dimension of the liquid crystal panel or substrate to be accommodated, and to place the liquid crystal panels or substrates layer by layer through the slot pins extending from the adjacent struts. For the liquid crystal panels or substrates in different dimensions, it is required to modify the dimension of the cassette, i.e., to change the positions of the adjacent struts, so as to accommodate the liquid crystal panels or substrates between the adjacent struts.

As shown in FIGS. 2-5, the cassette for accommodating the liquid crystal panels or substrates in the embodiments of the present disclosure includes a frame structure 10, a first strut 21 and a second strut 22 extending in a second direction F2 perpendicular to a first direction F1. The first stmt 21 and the second strut 22 are capable of be moved in the first direction F1 within the frame structure 10. A plurality of slot pins 23 for supporting the liquid crystal panels or substrates are distributed on the first strut 21 and the second stmt 22 in the second direction F2.

In the related art, for the liquid crystal panels or substrates 1 in different dimensions, the first strut 21 and the second strut 22 may be moved manually in the first direction F1 (i.e., to change the dimension of the cassette). At this time, an error may easily occur, and the liquid crystal panels or substrates 1, as well as a mechanical arm 2, may be damaged. According to the dimension detection device in the embodiments of the present disclosure, before the use of the cassette, the modified dimension of the cassette may be detected by the operator, and when an error occurs, the alarm may be sent. As a result, it is able to effectively prevent the liquid crystal panels or mechanical arm from being damaged due to improper dimension of the cassette, thereby to reduce any unnecessary losses.

Figure 2:
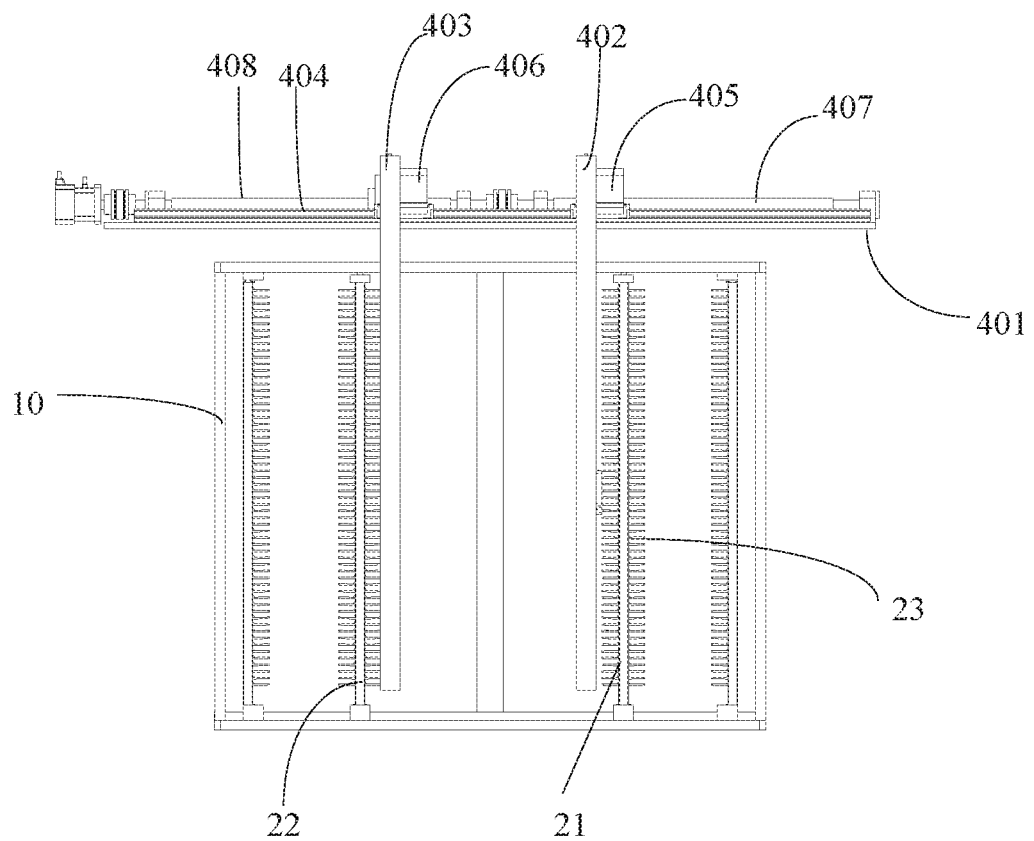
FIG. 2 is a front view of a dimension detection device when detecting a dimension of a cassette according to at least one embodiment of the present disclosure.
Figure 3:
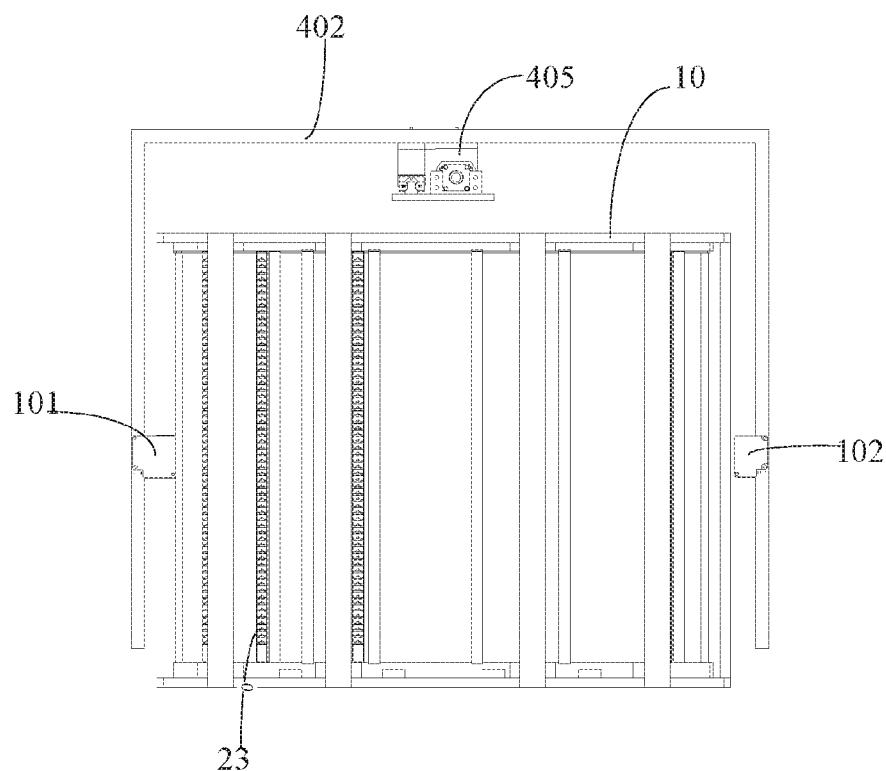
FIG. 3 is a side view of the dimension detection device in FIG. 2.
Figure 4:
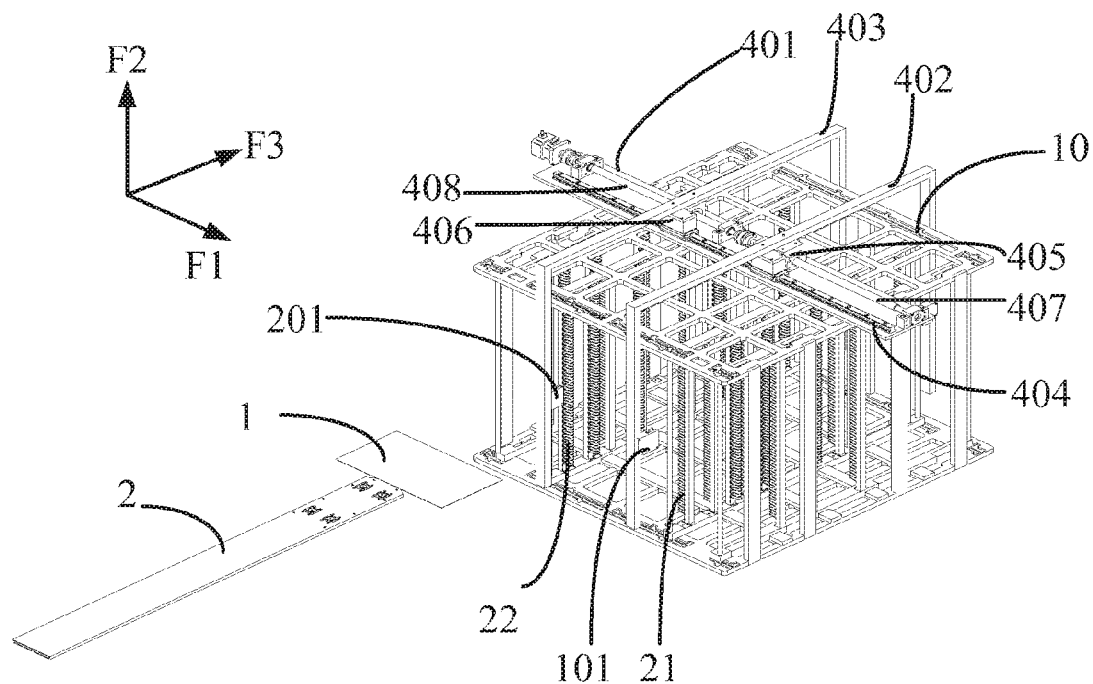
FIG. 4 is a perspective view of the dimension detection device when detecting the dimension of the cassette according to at least one embodiment of the present disclosure.
Figure 5:
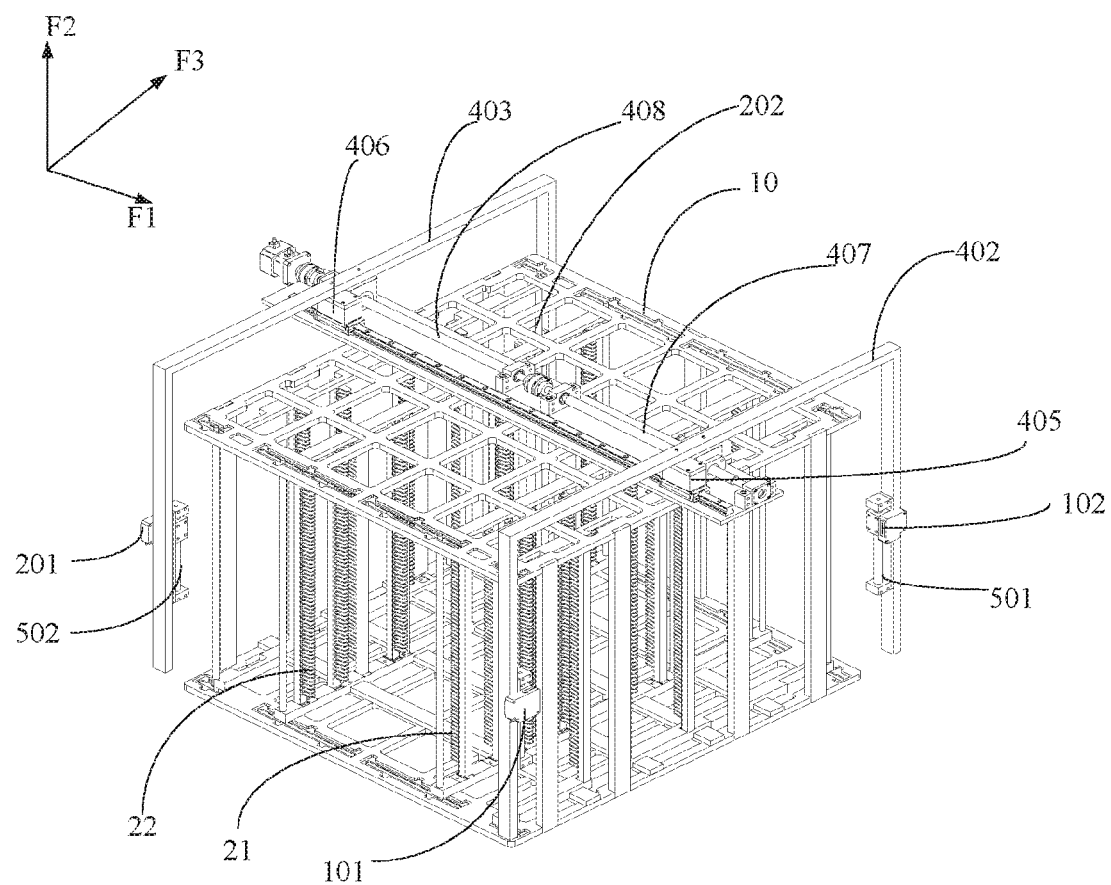
FIG. 5 is a perspective view of the dimension detection device at an initial position after the detection of the dimension of the cassette has been completed according to at least one embodiment of the present disclosure.

When detecting the dimension of the cassette by the dimension detection device in the embodiments of the present disclosure, the operator may move the first strut 21 and the second strut 22 in the first direction so as to modify the dimension of the cassette. Then, the first detection unit and the second detection unit are moved by the movement unit from the initial positions (e.g., the positions as shown in FIG. 5) to the predetermined positions corresponding to the dimension of the current liquid panel or substrate 1 (e.g., the positions as shown in FIGS. 2-4). The first detection unit is used to detect whether or not the current position of the first strut 21 is a right position (e.g., whether or not the first detection unit is exactly arranged opposite to the first strut 21 in a third direction F3 perpendicular to the first direction F1), and the second detection unit is used to detect whether or not the current position of the second strut 22 is a right position (e.g., whether or not the second detection unit is exactly arranged opposite to the second strut 22 in the third direction F3 perpendicular to the first direction F1). When it is detected that an error occurs for the first start 21 and/or the second strut 22, an alarm is sent by the alarm unit. Then, the operator moves the first strut 21 and the second strut 22 again, so as to modify the dimension of the cassette, until no alarm is sent by the alarm unit. Finally, the first detection unit and the second detection unit are moved by the movement unit in the first direction F1 to the initial positions (the positions as shown in FIG. 5), so as to enable the mechanical arm 2 to pick and place the liquid crystal panels or substrates 1.

Alternatively, as shown in FIGS. 2-7, the first detection unit includes: a first laser beam transmitter 101 arranged at a side o the first member and configured to transmit parallel laser beams, a plane formed by the parallel laser beams from the first laser beam transmitter 101 being perpendicular to the first direction F1; and a first laser beam receiver 102 arranged at another side of the first member, and configured to receive the parallel laser beams from the first laser beam transmitter 101, and when a light intensity of the received laser beams is less than a predetermined light intensity, send the first signal.

Figure 6:
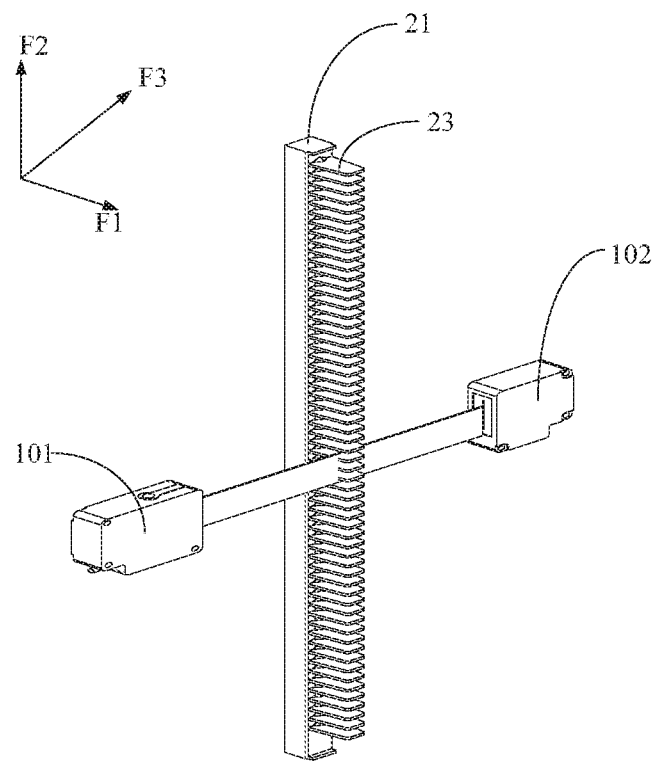
FIG. 6 is a schematic view showing a situation where a first detection unit detects that a first strut is not located at a third predetermined position according to at least one embodiment of the present disclosure.
Figure 7:
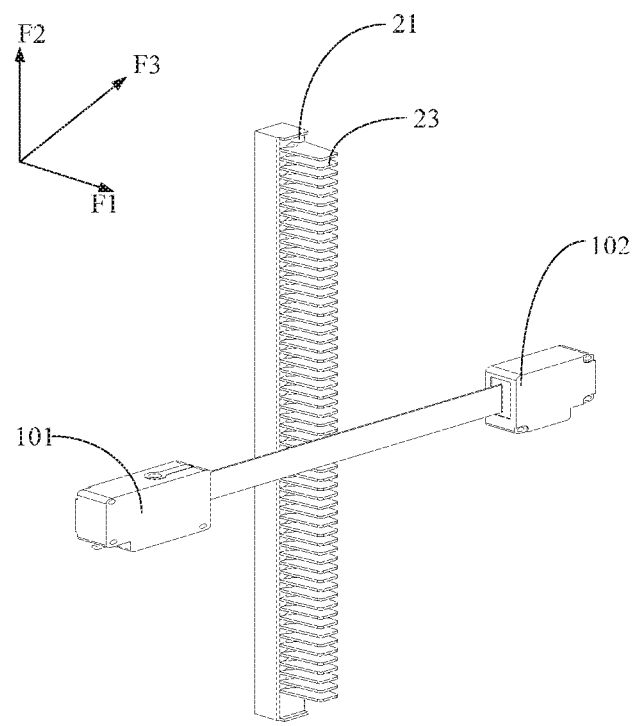
FIG. 7 is a schematic view showing a situation where the first detection unit detects that the first strut is located at the third predetermined position according to at least one embodiment of the present disclosure.

The first detection unit may use a laser sensor to detect the position of the first strut 21. To be specific, as shown in FIGS. 2-7, the first laser beam, transmitter 101 and the first laser beam receiver 102 are arranged at both sides of the first stmt 21 in the cassette respectively, and the first laser beam transmitter 101 transmits the parallel laser beams, a plane formed by the parallel laser beams is perpendicular to the first direction F1. In this way, when the first strut 21 is not located at the third predetermined position corresponding to the first laser beam transmitter 101 (i.e., the first strut 21 is not located at a position where the parallel laser beams from the first laser beam transmitter 101 are not blocked), as shown in FIG. 6, the slot pins 23 on the first strut 21 may block parts of the laser beams from the first laser beam transmitter 101, so that the light intensity of the laser beams received by the first laser beam receiver 102 is less than the predetermined light intensity. At this time, the first laser beam receiver 102 may send the first signal to the alarm unit, so that the alarm unit may send the alarm. When the first strut 21 is located at the third predetermined position (i.e., the first strut 21 is located at a position where the parallel laser beams from the first laser beam transmitter 101 are not blocked), as shown in FIG. 7, the slot pins 23 on the first strut 21 may not block the laser beams from the first laser beam transmitter 101, so that the light intensity of the laser beams received by the first laser beam receiver 102 is equal to the predetermined light intensity. At this time, the first signal is not sent by the first laser beam receiver 102 to the alarm unit.

Similarly, as shown in FIGS. 4-5, the second detection unit includes: a second laser beam transmitter 201 arranged at a side of the second member and configured to transmit parallel laser beams, a plane formed by the parallel laser beams from the second laser beam, transmitter 201 being perpendicular to the first direction F1; and a second laser beam receiver 202 arranged at another side of the second member, and configured to receive the parallel laser beams from the second laser beam transmitter 201, and when a light intensity of the received laser beams is less than a predetermined light intensity, send the second signal.

The second detection unit may also use a laser sensor to detect the position of the second strut 22. To be specific, the second laser beam transmitter 201 and the second laser beam receiver 202 are arranged at both sides of the second strut 22 in the cassette respectively, and the second laser beam transmitter 201 transmits the parallel laser beams, a plane formed by the parallel laser beams, is perpendicular to the first direction F1. In this way, when the second strut 22 is not located at the fourth predetermined position corresponding to the second laser beam transmitter 201 (i.e., the second strut 22 is not located at a position where the parallel laser beams from the second laser beam transmitter 201 are not blocked), the slot pins 23 on the second strut 22 may block parts of the laser beams from the second laser beam transmitter 201, so that the light intensity of the laser beams received by the second laser beam receiver 202 is less than the predetermined light intensity. At this time, the second laser beam receiver 202 may send the second signal to the alarm unit, so that the alarm unit may send the alarm. When the second stmt 22 is located at the fourth predetermined position (i.e., the second stmt 22 is located at a position where the parallel laser beams from the second laser beam transmitter 201 are not blocked), the slot pins 23 on the second strut 22 may not block the laser beams from the second laser beam transmitter 201, so that the light intensity of the laser beams received by the second laser beam receiver 202 is equal to the predetermined light intensity. At this time, the second signal is not sent by the second laser beam receiver 202 to the alarm unit.

In the above embodiments, the first laser beam transmitter 101, the first laser beam receiver 102, the second laser beam transmitter 201 and the second laser beam receiver 202 may be light-transmittable laser sensors, e.g., KEYENCE IB-30. In addition, the laser sensors are used by the first detection unit and the second detection unit to detect the positions, and depending on the characteristics of the parallel laser beams from the laser sensors, it is able to detect the positions and send the alarm in accordance with the light intensity even when the dimension of the cassette is slightly changed, so the detection accuracy is high. Moreover, the laser sensor transmits the laser beams having multiple wavelengths, so a detection error may not occur due to the external environments, and the detection may be performed in a stable manner.

It should be appreciated that, in some other embodiments of the present disclosure, the first detection unit and the second detection unit may also use any other position sensors. In other words, the structures of the first detection unit and the second detection unit are not limited to those mentioned above.

Alternatively, the movement unit includes a first movement mechanism for moving the first detection unit and the second detection unit in the first direction F1. Through the first movement mechanism, it is able to move the first detection unit and the second detection unit to different predetermined positions with respect to the liquid crystal panels or substrates in different dimensions, thereby to detect the dimension of the cassette.

Alternatively, as shown in FIGS. 2-5, the first movement mechanism includes; a fixation plate 401 fixed onto the to-be-detected piece; a first connection rod 402 on which the first detection unit is mounted; a second connection rod 403 on which the second detection unit is mounted; a guide rail 404 arranged on the fixation plate 401 and extending in the first direction F1; a first slider 405 and a second slider 406 arranged on the guide rail 404 and capable of being moved along the guide rail 404, the first slider 405 being connected to the first connection rod 402 and configured to move the first connection rod 402, and the second slider 406 being connected to the second connection rod 403 and configured to move the second connection rod 403; and a driving mechanism configured to drive the first slider 405 and the second slider 406 to move along the guide rail 404.

The fixation plate 401 may be fixed onto the frame structure 10 of the cassette. The first laser beam transmitter 101 and the first laser beam receiver 102 may be arranged at both sides of the first strut 21 through the first connection rod 402 respectively, and the second laser beam transmitter 201 and the second laser beam receiver 202 may be arranged at both sides of the second strut 22 through the second connection rod 403 respectively. The first slider 405 is driven by the driving mechanism to move on the guide rail 404 in the first direction F1, so as to move the first connection rod 402 in the first direction F1 until the first laser beam transmitter 101 and the first laser beam receiver 102 have been moved to the first predetermined position. The second slider 405 is driven by the driving mechanism to move on the guide rail 404 in the first direction F1, so as to move the second connection rod 403 in the first direction F1 until the second laser beam transmitter 201 and the second laser beam receiver 202 have been moved to the second predetermined position.

It should be appreciated that, in some other embodiments of the present disclosure, the first movement mechanism may be implemented in various ways. In other words, the structure of the first movement mechanism is not limited to that mentioned above.

Alternatively, as shown in FIGS. 2-5, the driving mechanism includes a first screw rod 407 extending in the first direction F1 and cooperating with the first slider 405, a second screw rod 408 extending in the first direction F1 and cooperating with the second slider 406, a first drive motor configured to drive the first screw rod 407, and a second drive motor configured to drive the second screw rod 408.

The first drive motor and the second drive motor may each be a servo motor, and the first screw rod 407 may be connected to the second screw rod 408 via a coupling. Through the cooperation of the servo motors with the screw rods, it is able to move the first detection unit and the second detection unit in more accurate manner, thereby to accurately position the first detection unit and the second detection unit.

It should be appreciated that, in some other embodiments of the present disclosure, the driving mechanism may be of any other structure, e.g., a cylinder, which is not particularly defined herein.

In addition, as shown in FIGS. 2-7, the first strut 21 (i.e., the first member) and the second start 22 (i.e., the second member) in the cassette are each of a column structure extending in the second direction F2 perpendicular to the first direction F1. When the slot pins 23 at certain positions of the first strut 21 or the second strut 22 are missed or deformed and the laser beam from the first laser beam transmitter 101 or the second laser beam transmitter 201 is just transmitted through the space formed due to the missed or deformed slot pins 23, a detection error may occur.

In order to overcome this drawback, alternatively, the movement unit further includes a second movement mechanism configured to move the first detection unit and the second detection unit in the second direction F2. Through the second movement mechanism, it is able to move the first detection unit and the second detection unit in the extension direction of the first strut 21 and the second start 22 (i.e., the second direction F2), so as to detect the dimension of the cassette at at least two positions in the second direction F2, thereby to avoid the detection error.

It should be appreciated that, in some other embodiments, at least two first detection units may be directly arranged on the first connection rod 402 in the second direction F2, and at least two second detection units may be directly arranged on the second connection rod 403 in the second direction F2, so as to detect the dimension of the cassette at the at least two positions in the second direction F2.

Alternatively, as shown in FIG. 5, the second movement mechanism includes a first cylinder 501 configured to drive the first detection unit to move in the second direction F2, and a second cylinder 502 configured to drive the second detection unit to move in the second direction F2.

As mentioned above, the first detection unit and the second detection unit may be driven by the cylinders to move in the second direction. In addition, a delimiting structure may be arranged on each of the first connection rod and the second connection rod, so as to ensure that, when the first detection unit and the second detection unit are moved in the second direction, the first laser beam transmitter of the first detection unit is arranged at a position corresponding to the first laser beam receiver, and the second laser beam transmitter of the second detection unit is arranged at a position corresponding to the second laser beam receiver.

It should be appreciated that, in some other embodiments, the second movement mechanism may also be implemented in any other structure, e.g., servo motors cooperating with the screw rods, which is not particularly defined herein.

Alternatively, the dimension detection device further includes a control unit configured to control the movement unit. The control unit includes a storage module configured to store information about the predetermined positions of the first detection unit and the second detection unit, and a control module configured to control the first detection unit to move to the first predetermined position and/or control the second detection unit to move to the second predetermined position in accordance with the information stored in the storage module.

As mentioned above, before the detection of the cassette using the dimension detection device, the predetermined positions of the first detection unit and the second detection unit corresponding to the liquid crystal panels or substrates in different dimensions may be set in advance, and the information about the predetermined positions may be stored. When it is necessary to switch between the liquid crystal panels or substrates in different dimensions on a production line, it is able to rapidly change the predetermined positions of the first detection unit and the second detection unit corresponding to the current liquid crystal panel or substrate through an externally-inputted command from the control unit after the dimension of the cassette has been changed. In this way, it is able to detect whether or not the dimension of cassette modified manually is appropriate when the current liquid crystal panel or substrate is to be accommodated within the cassette, thereby to achieve the rapid switching. As a result, through the high-precise and automatic detection, it is able to effectively prevent the error due to the misoperation of the operator, thereby to prevent the product and the mechanical arm from being damaged.

A procedure for detecting the dimension of the cassette by the dimension detection device will be described hereinafter.

At first, the operator may move the first stmt 21 and the second strut 22, so as to modify the dimension of the cassette.

Next, the first screw rod 407 and the second screw rod 408 may be driven by the servo motors respectively, so as to move the first laser beam transmitter 101, the first laser beam receiver 102, the second laser beam transmitter 201 and the second laser beam receiver 202 in the first direction F1 from the initial positions (e.g., the positions as shown in FIG. 5) to the predetermined positions corresponding to the dimension of the current liquid crystal panel or substrate (e.g., the positions as shown in FIG. 4). The first laser beam transmitter 101 and the second laser beam receiver 102 may be used to detect whether or not the current position of the first strut 21 is a right position, and the second laser beam transmitter 201 and the second laser beam receiver 202 may be used to detect whether or not the current position of the second strut 22 is a right position.

Then, the first laser beam transmitter 101, the first laser beam receiver 102, the second laser beam transmitter 201 and the second laser beam receiver 202 are moved by the first cylinder and the second cylinder in the second direction F2 to the other predetermined positions respectively. The first laser beam transmitter 101 and the first laser beam receiver 102 may be used to detect whether or not the current position of the first stmt 21 is a right position, and the second laser beam transmitter 201 and the second laser beam receiver 202 may be used to detect whether or not the current position of the second strut 22 is a right position.

When an error occurring for the positions of the first strut 21 and/or the second strut 22 has been detected, an alarm may be sent by the alarm unit, and at this time, the operator may move the first strut 21 and/or the second stmt 22 again, so as to modify the dimension of the cassette until no alarm is sent by the alarm unit.

Finally, after the detection has been completed, the first screw rod and the second screw rod may be driven by the servo motors, so as to move the first laser beam transmitter 101, the first laser beam receiver 102, the second laser beam transmitter 201 and the second laser beam receiver 202 in the first direction F1 to the initial positions as shown in FIG. 5, thereby to enable the mechanical arm 2 to pick and place the liquid crystal panel or substrate.

It should be appreciated that, as shown in FIGS. 1 and 2, the cassette may have four struts. For a large-size liquid crystal panel or substrate, the two struts in the middle may be used to support the liquid crystal panel or substrate, and at this time, merely the positions of the two struts in the middle may be detected by the dimension detection device. For a small-size liquid crystal panel or substrate, the two adjacent struts on the left or right may be grouped to support the liquid crystal panel or substrate, and at this time, the positions of the two struts in each group may be detected by the dimension detection device.

The present disclosure further provides in some embodiments the cassette including the above-mentioned dimension detection device. As shown in FIGS. 2-5, the cassette further includes a body for supporting the liquid crystal panel or substrate, and this body is just the conventional cassette. The body includes the first strut 21 and the second strut 22 extending in the second direction F2 and capable of being moved in the first direction F1 within the frame structure 10, and a plurality of slot pins 23 for supporting the liquid crystal panel or substrate is distributed on the first strut 21 and the second strut 22 in the second direction F2. In the embodiments of the present disclosure, the first member is the first strut 21, and the second member is 20 the second strut 22.

According to the cassette including the dimension detection device in the embodiments of the present disclosure, before the use of the cassette, the modified dimension of the cassette may be detected by the operator through detecting the positions of the two struts in the cassette. When there is an error in the modified dimension of the cassette, the alarm may be sent. As a result, it is able to effectively prevent the liquid crystal panel or a mechanical arm from being damaged due to the error in the dimension of the cassette, thereby to reduce the unnecessary losses.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A dimension detection device for detecting whether or not a first member and a second member in a to-be-detected piece are at predetermined positions, comprising:
    a first detection unit which is moved to a first predetermined position in a first direction, and configured to detect a current position of the first member, and when the current position of the first member is not a third predetermined position corresponding to the first predetermined position, send a first signal;
    a second detection unit which is moved to a second predetermined position in the first direction, and configured to detect a current position of the second member, and when the current position of the second member is not a fourth predetermined position corresponding to the second predetermined position, send a second signal;
    a movement unit configured to move the first detection unit and the second detection unit; and
    an alarm unit configured to send an alarm upon the receipt of the first signal and/or the second signal.

2. The dimension detection device according to claim 1, wherein the first detection unit comprises:
    a first laser beam transmitter arranged at a side of the first member and configured to transmit parallel laser beams, a plane formed by the parallel laser beams from the first laser beam transmitter being perpendicular to the first direction; and
    a first laser beam receiver arranged at another side of the first member, and configured to receive the parallel laser beams from the first laser beam transmitter, and when a light intensity of the received laser beams is less than a predetermined light intensity, send the first signal.

3. The dimension detection device according to claim 2, wherein the first laser beam transmitter and the first laser beam receiver are each a light-transmittable laser sensor.

4. The dimension detection device according to claim 1, wherein the second detection unit comprises:
    a second laser beam transmitter arranged at a side of the second member and configured to transmit parallel laser beams, a plane formed by the parallel laser beams from the second laser beam transmitter being perpendicular to the first direction; and
    a second laser beam receiver arranged at another side of the second member, and configured to receive the parallel laser beams from the second laser beam transmitter, and when a light intensity of the received laser beams is less than a predetermined light intensity, send the second signal.

5. The dimension detection device according to claim 4, wherein the second laser beam transmitter and the second laser beam receiver are each a light-transmittable laser sensor.

6. The dimension detection device according to claim 1, wherein the movement unit comprises a first movement mechanism for moving the first detection unit and the second detection unit in the first direction.

7. The dimension detection device according to claim 6, wherein the first movement mechanism comprises:
    a fixation plate fixed onto the to-be-detected piece;
    a first connection rod on which the first detection unit is mounted;
    a second connection rod on which the second detection unit is mounted;
    a guide rail arranged on the fixation plate and extending in the first direction;
    a first slider and a second slider arranged on the guide rail and capable of being moved along the guide rail, the first slider being connected to the first connection rod and configured to move the first connection rod, and the second slider being connected to the second connection rod and configured to move the second connection rod; and
    a driving mechanism configured to drive the first slider and the second slider to move along the guide rail.

8. The dimension detection device according to claim 7, wherein the driving mechanism comprises;
    a first screw rod extending in the first direction and cooperating with the first slider;
    a second screw rod extending in the first direction and cooperating with the second slider;
    a first drive motor configured to drive the first screw rod; and
    a second drive motor configured to drive the second screw rod.

9. The dimension detection device according to claim 8, wherein the first drive motor and the second drive motor are each a servo motor, and the first screw rod is connected to the second screw rod via a coupling.

10. The dimension detection device according to claim 6, wherein the first member and the second member are each of a column structure extending in a second direction perpendicular to the first direction, and the movement unit further comprises a second movement mechanism configured to move the first detection unit and the second detection unit in the second direction.

11. The dimension detection device according to claim 10, wherein the second movement mechanism comprises:
 a first cylinder configured to drive the first detection unit to move in the second direction; and
 a second cylinder configured to drive the second detection unit to move in the second direction.

12. The dimension detection device according to claim 11, further comprising a delimiting structure arranged on each of the first connection rod and the second connection rod, so as to enable the first laser beam transmitter of the first detection unit to be located at a position corresponding to the first laser beam receiver and enable the second laser beam transmitter of the second detection unit to be located at a position corresponding to the second laser beam receiver when the first detection unit and the second detection unit are moved in the second direction.

13. The dimension detection device according to claim 10, wherein the second movement mechanism comprises a servo motor and a screw rod.

14. The dimension detection device according to claim 1, further comprising a control unit configured to control the movement unit, wherein
 the control unit comprises a storage module configured to store information about the predetermined positions of the first detection unit and the second detection unit, and a control module configured to control the first detection unit to move to the first predetermined position and/or control the second detection unit to move to the second predetermined position in accordance with the information stored in the storage module.

15. The dimension detection device according to claim 1, wherein the to-be-detected piece is a cassette for accommodating a liquid crystal panel or a substrate,
 the cassette comprises a first strut and a second strut extending in the second direction and capable of being moved in the first direction, and a plurality of slot pins for supporting the liquid crystal panel or substrate is distributed on the first strut and the second strut in the second direction, and
 the first member is the first strut and the second member is the second strut.

16. A cassette, comprising a body, wherein
 the body comprises a first strut and a second strut extending in a second direction and capable of being moved in a first direction, and a plurality of slot pins is distributed on the first strut and the second strut in the second direction,
 the cassette further comprises the dimension detection device according to claim 1, and
 the first member is the first strut and the second member is the second strut.

17. A dimension detection method for detecting a dimension of the cassette according to claim 16, comprising steps of:
 moving a first strut and a second strut in a first direction, so as to modify the dimension of the cassette;
 moving a first detection unit and a second detection unit by a movement unit from initial positions to predetermined positions corresponding to a dimension of a substrate to be currently accommodated in the cassette respectively:
 detecting by the first detection unit whether or not a current position of the first strut is a right position, detecting by the second detection unit whether or not a current position of the second strut is a right position, and when an error occurring for the positions of the first strut and/or the second strut has been detected, sending an alarm by an alarm unit; and
 moving the first strut and the second strut again when the alarm is sent by the alarm unit, so as to modify the dimension of the cassette until no alarm is sent by the alarm unit.

18. The method according to claim 17, wherein the step of detecting whether or not the current position of the first strut is a right position comprises:
 detecting whether or not the first detection unit is exactly arranged opposite to the first strut in a third direction perpendicular to the first direction.

19. The method according to claim 17, wherein the step of detecting whether or not the current position of the second strut is a right position comprises:
 detecting whether or not the second detection unit is exactly arranged opposite to the second strut in a third direction perpendicular to the first direction.

20. The method according to claim 17, further comprising moving the first detection unit and the second detection unit by the movement unit in the first direction to the initial positions respectively after no alarm is sent by the alarm unit any more.

* * * * *